United States Patent
Su

(10) Patent No.: US 7,797,824 B2
(45) Date of Patent: Sep. 21, 2010

(54) PRINTED CIRCUIT BOARD AND METHOD FOR DECREASING IMPEDANCE OF A POWER SOURCE THEREOF

(75) Inventor: Thonas Su, Taipei (TW)

(73) Assignee: NVIDIA Corporation, Santa Clara, CA (US)

( * ) Notice: Subject to any disclaimer, the term of this patent is extended or adjusted under 35 U.S.C. 154(b) by 743 days.

(21) Appl. No.: 10/906,073

(22) Filed: Feb. 2, 2005

(65) Prior Publication Data

US 2006/0068582 A1  Mar. 30, 2006

(30) Foreign Application Priority Data

Sep. 30, 2004 (TW) ............... 93129644 A

(51) Int. Cl.
  *H05K 1/02* (2006.01)
  *H05K 3/00* (2006.01)
(52) U.S. Cl. .................... 29/846; 174/250; 174/255
(58) Field of Classification Search .............. 29/830, 29/846, 847, 849, 851, 831; 174/255, 261, 174/260, 250
See application file for complete search history.

(56) References Cited

U.S. PATENT DOCUMENTS

| | | | | | |
|---|---|---|---|---|---|
| 4,933,741 | A | * | 6/1990 | Schroeder | 257/672 |
| 5,131,140 | A | * | 7/1992 | Zimmer | 29/846 |
| 5,376,759 | A | * | 12/1994 | Marx et al. | 174/255 |
| 5,854,085 | A | * | 12/1998 | Raab et al. | 438/123 |
| 6,303,680 | B1 | * | 10/2001 | Neiss | 524/430 |
| 6,465,890 | B1 | * | 10/2002 | Poddar et al. | 257/773 |
| 6,608,377 | B2 | * | 8/2003 | Chang et al. | 257/700 |
| 6,812,409 | B2 | * | 11/2004 | Chen et al. | 174/255 |
| 2002/0100987 | A1 | * | 8/2002 | Chang et al. | 257/781 |

* cited by examiner

*Primary Examiner*—A. Dexter Tugbang
*Assistant Examiner*—Livius R Cazan
(74) *Attorney, Agent, or Firm*—Patterson & Sheridan, LLP

(57) ABSTRACT

A method for decreasing impedance of a power source in a printed circuit board includes: (a) forming a first metal plane over a first layer of the printed circuit board; (b) forming a second metal plane and a third metal plane over a second layer of the printed circuit board; (c) forming a dielectric layer between the first layer and the second layer of the printed circuit board for insulating the first layer from the second layer; and (d) connecting the second metal plane to an electric potential different from an electric potential of the first metal plane and the third metal plane.

10 Claims, 16 Drawing Sheets

| Conditions | Input impedance @1Mhz | Input impedance @10Mhz | Input impedance @100Mhz | Loop inductance LLoop(100Mhz) | Loop resistance RLoop(100Mhz) | Direct-current resistance RDC |
|---|---|---|---|---|---|---|
| Motherboard 100 | 0.1515 | 1.455 | 15.253 | ~24.276 nH | 0.0781 | 0.0173 |
| Motherboard 60 | 0.1176 | 1.098 | 11.292 | ~17.872 nH | 0.0812 | 0.0159 |
| Motherboard 80 | 0.1038 | 0.943 | 9.553 | ~15.204 nH | 0.0913 | 0.0189 |
| Motherboard 90 | 0.0934 | 0.824 | 8.218 | ~13.079 nH | 0.1073 | 0.0238 |

Fig. 12

| Conditions | Input impedance @1Mhz | Input impedance @10Mhz | Input impedance @100Mhz | Loop inductance LLoop(100Mhz) | Loop resistance RLoop(100Mhz) | Direct-current resistance RDC |
|---|---|---|---|---|---|---|
| Motherboard 80 | 0.1038 | 0.943 | 9.553 | ~15.204 nH | 0.0913 | 0.0189 |
| Motherboard 110 | 0.0969 | 0.860 | 8.599 | ~13.686 nH | 0.0976 | 0.0177 |
| Motherboard 90 | 0.0934 | 0.824 | 8.218 | ~13.079 nH | 0.1073 | 0.0238 |
| Motherboard 120 | 0.0816 | 0.695 | 6.814 | ~10.845 nH | 0.0998 | 0.0202 |

Fig. 16

PRINTED CIRCUIT BOARD AND METHOD FOR DECREASING IMPEDANCE OF A POWER SOURCE THEREOF

BACKGROUND OF INVENTION

1. Field of the Invention

The present invention provides a method for decreasing impedance of a power source in a printed circuit board, and more particularly, a method for decreasing impedance by depositing other ground planes in a routing layer of a power plane.

2. Description of the Prior Art

A printed circuit board, or PCB, is a support for elements of an electric device, and provides electrical connections between the elements. With highly developed electronic technologies, PCB density becomes higher and higher, so the PCB affects the anti-interference ability of the electric device a lot. Generally, even if a circuit diagram of the electric device is designed accurately, the PCB having some problems still decreases performance and reliability of the electric device. For example, regarding a motherboard of a computer, if the motherboard is not designed properly, signal exchanging between devices in the computer may suffer problems.

Considering the cost of production, a prior art motherboard usually has four routing layers. Please refer to FIG. 1, which illustrates a sectional diagram of a prior art motherboard 10. The motherboard 10 includes routing layers 12, 14, 16, 18, and dielectric layers 20, 22, 24. The routing layers 12, 14, 16, and 18 lay out a power plane, a ground plane, and circuit planes by means of copper plating and etching. The dielectric layers 20, 22, and 24 are made of a FR4 material for insulating the neighboring routing layers, where thicknesses of the dielectric layers 20, 22, and 24 are usually 4.4 mils, 48 mils, and 4.4 mils (1000 mils=1 inch). Therefore, if the power plane is laid out in the routing layer 12, and the ground plane is laid out in the routing layer 14, or the power plane is laid out in the routing layer 18, and the ground plane is laid out in the routing layer 16, there is a strong coupling between the power plane and the ground plane. The reason, as shown in FIG. 1, is that the distance between the routing layer 14 and the routing layer 16 is 48 mils, while the distances between the routing layer 12 and the routing layer 14, and between the routing layer 16 and the routing layer 18, are only 4.4 mils. However, when considering performance, production cost, and manufacturing, the circuit planes of the motherboard 10 are laid out in the routing layers 12 and 18, which are the outermost layers of the motherboard 10, and the power plane and the ground plane are laid out in the routing layers 14 and 16, meaning that the power plane and the ground plane of the motherboard 10 are separated by the thickest dielectric layer 22 made of the FR4 material. Regarding power supply, the ground plane is a return path of the power plane; that is, current outputted from the power plane flowing into the ground plane forms a loop. As a result, the closer the power plane and the ground plane, the smaller the loop inductance between the power plane and the ground plane, and as those skilled in the art recognize, the smaller the loop inductance, the lower the power impedance within a frequency range.

As to one effect of the thickness of the dielectric layer between the power plane and the ground plane upon the power impedance, please refer to FIG. 2 and FIG. 3. FIG. 2 illustrates a schematic diagram of a two-layer PCB 30. The PCB 30 includes a power plane 32, a ground plane 34, and a dielectric layer 30 made of the FR4 material between the power plane 32 and the ground plane 34. FIG. 3 illustrates a graph of input impedance to frequency when the thicknesses of the dielectric layer 36 are 5, 10, and 20 mils, and where the y-axis is input impedance, the x-axis is frequency, and lines 304, 302, 300 represent relations between input impedance and frequency when the dielectric layer 36 are 5, 10, and 20 mils respectively. As shown in FIG. 3, at a given frequency, the thicker the dielectric layer 36, the higher the input impedance of the PCB 30. Moreover, owing to a dominant pole of the PCB 30, the impedance of the PCB 30 rises quickly and suddenly in a range of high frequencies, or 1000 MHz to 5000 MHz, which limits the bandwidth of the PCB 30, causing a bottleneck of the PCB 30 with regard to high-frequency applications. That is, as the thickness of the dielectric layer between the power plane 32 and the ground plane 34 increases, input impedance of the PCB 30 increases, and the bandwidth of the PCB 30 decreases as well. Equivalent inductances of the dielectric layer 36, corresponding to 5, 10, and 20 mils thick at 100 MHz, are 2.85, 4.52, and 7.99 nH, so the thicker dielectric layer 36 causes larger equivalent inductance. Furthermore, in a range of low frequencies (lower than 1 GHz), the PCB 30 can be seen as a series connection of resistance and inductance. Because resistance varies little in the low-frequency range, inductance plays an important role, dominating the impedance. In short, the less the distance between the power plane 32 and the ground plane 34, the lower the equivalent inductance, the wider the bandwidth, and the smaller the input impedance.

As mentioned above, when considering performance, production cost, and manufacturing, a problem with prior art PCB designs is that the power plane and the ground plane of the prior art motherboard are separated by the thickest dielectric layer, which increases the input impedance of the power source, and decreases performance of the motherboard in the high-frequency range.

SUMMARY OF INVENTION

It is therefore a primary objective of the claimed invention to provide a method for decreasing impedance of a power source in a printed circuit board.

According to the claimed invention, a method for decreasing impedance of a power source in a printed circuit board includes: forming a first metal plane over a first layer of the printed circuit board; forming a second metal plane and a third metal plane over a second layer of the printed circuit board, where a dielectric layer is disposed between the first layer and the second of the printed circuit board for insulating the first layer from the second layer; and connecting the second metal plane to an electric potential different from an electric potential of the first metal plane and the third metal plane.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 12 and FIG. 16 illustrate tables of input impedance, loop inductance, loop resistance, and direct-current resistance.

DETAILED DESCRIPTION

Figure 1:
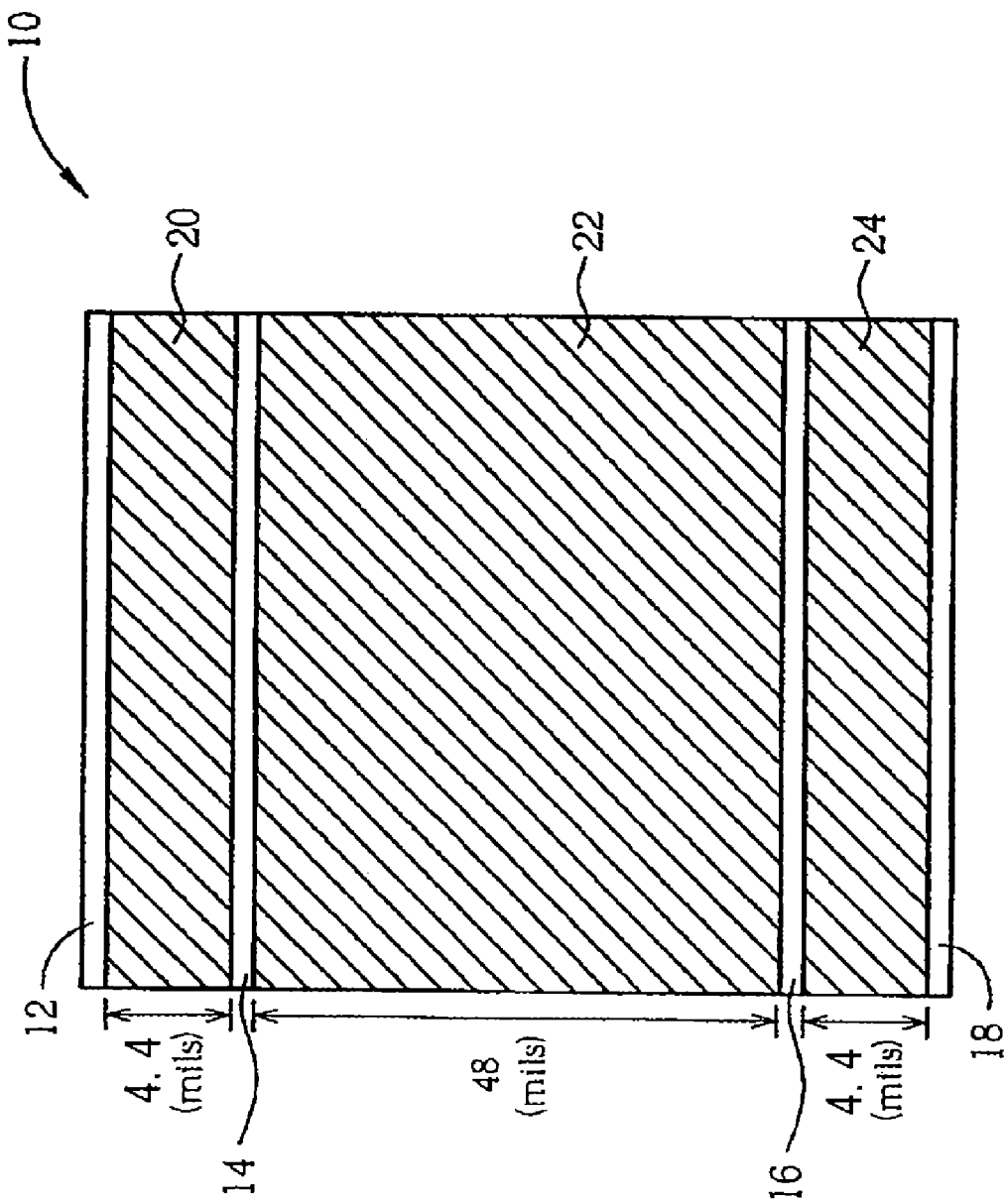
FIG. 1 illustrates a sectional diagram of a prior art motherboard.
Figure 2:
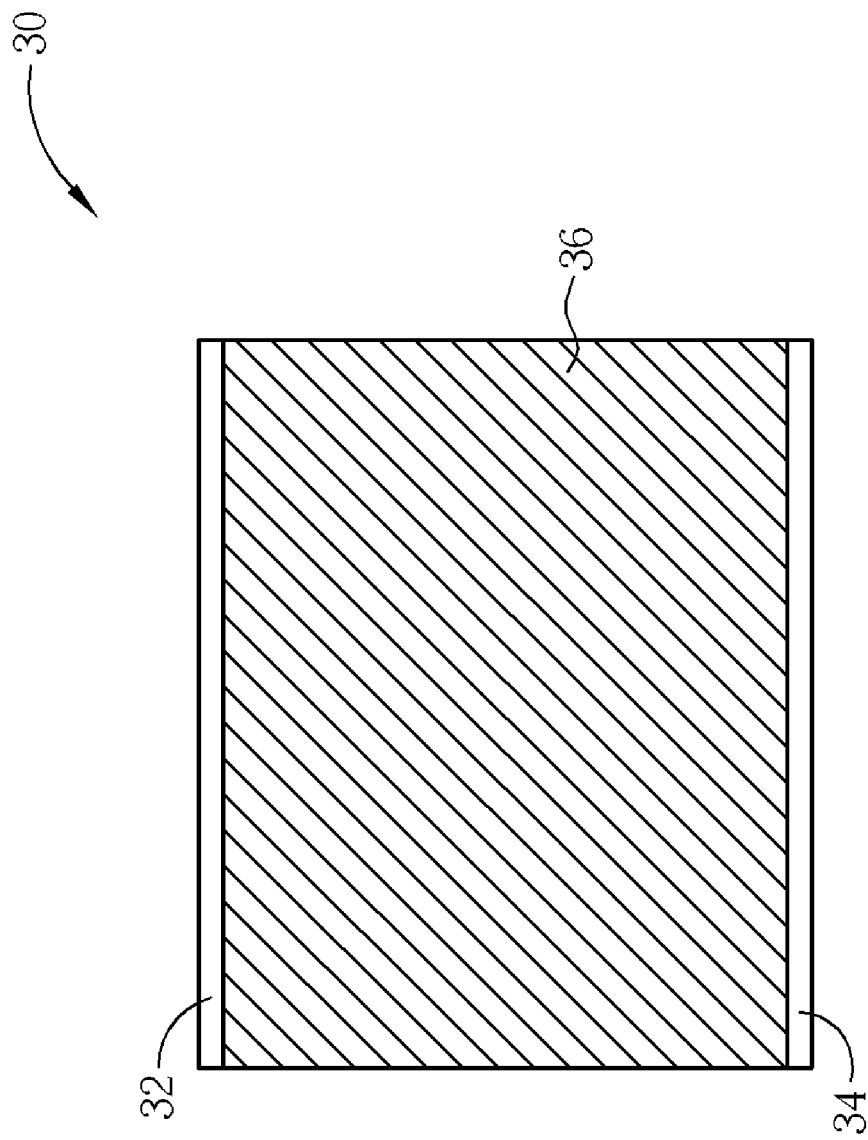
FIG. 2 illustrates a schematic diagram of a prior art two-layer PCB.
Figure 3:
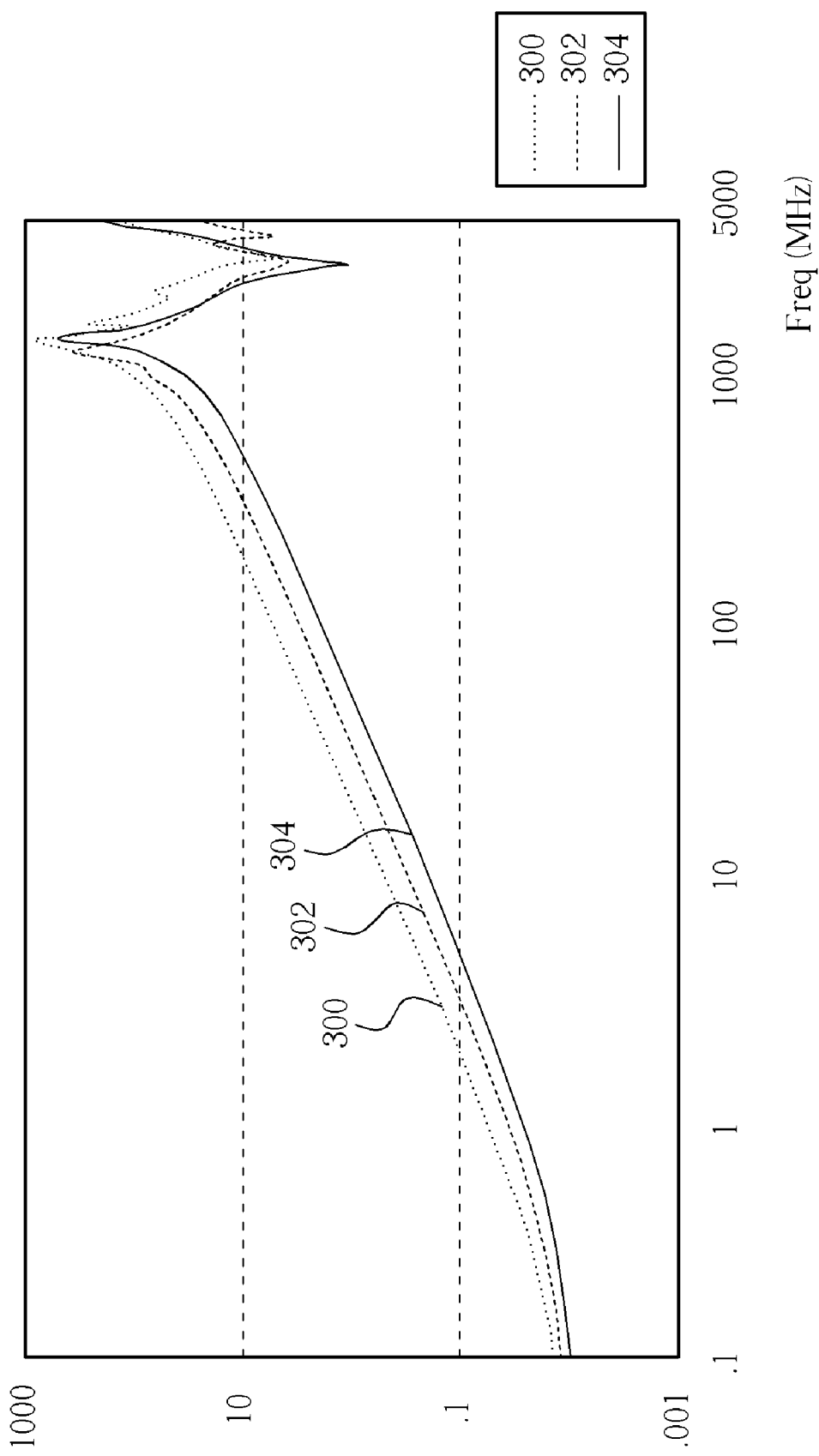
FIG. 3 shows a graph of input impedance to frequency in a prior art motherboard.
Figure 4:
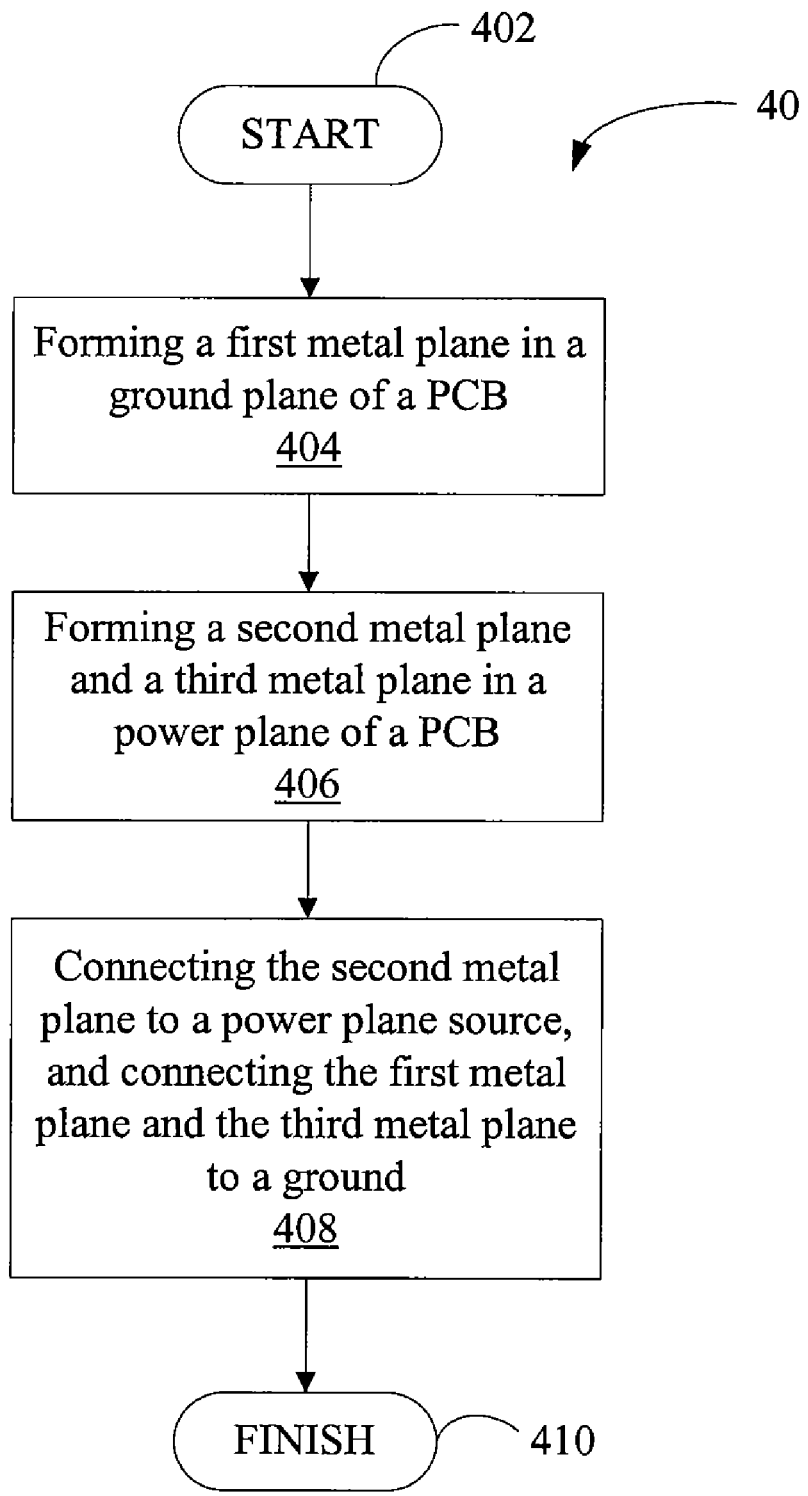
FIG. 4 illustrates a flowchart of a process for decreasing impedance of a power source in a printed circuit board in accordance with the present invention.

Please refer to FIG. 4, which illustrates a flowchart of a process 40 for decreasing impedance of a power source in a printed circuit board in accordance with the present invention. The process 40 includes the following steps:

Step 402: start.

Step 404: forming a first metal plane in a ground plane of a PCB;

Step 406: forming a second metal plane and a third metal plane in a power plane of the PCB, where a dielectric layer is disposed between the ground plane and the power plane of the PCB;

Step 408: connecting the second metal plane to a power source, and connecting the first metal plane and the third metal plane to a ground;

Step 410: finish.

Since currents outputted from the power plane flowing into the ground plane forms a loop, loop inductance of the PCB can be as follows:

$$L_{LOOP} = L_{PWR} + L_{GND} - 2L_M \qquad (eq\ 1)$$

where $L_{LOOP}$ is loop inductance, $L_{PWR}$ is self-inductance of the power plane, $L_{GND}$ is self-inductance of the ground plane, and $L_M$ is mutual inductance between the power plane and the ground plane. According to the loop-inductance equation, one way to decrease loop inductance is to decrease self-inductance of the power plane and the ground plane, or $L_{PWR}$ and $L_{GND}$, and another way is to increase mutual inductance between the power plane and the ground plane, or $L_M$. However, the former one requires increasing a cross-sectional area of the power plane of the PCB in the horizontal direction, which increases the cost of production; moreover, there is no redundant area of the PCB for increasing the area of the power plane. Therefore, the present invention process 40 is focused on increasing mutual inductance between the power plane and the ground plane, or $L_M$, so as to decrease loop inductance.

According to the process 40, the present invention forms the first metal plane in the ground plane of the PCB for providing a ground with the first metal plane, and forms the second metal plane and the third metal plane in the power plane of the PCB for providing a power source with the second metal plane and for providing a ground with the third metal plane. In addition, the process 40 forms the dielectric layer between the ground plane and the power plane of the PCB for insulating the ground plane and the power plane. In short, the process 40 is to provide another ground in the power plane of the PCB with the metal plane, so as to decrease the distance between the power plane and the ground plane. In other words, since the dielectric layer of the PCB is for insulating between the ground plane and the power plane, the dielectric layer decreases coupling between the ground plane and the power plane certainly. However, the process 40 increases coupling between the ground plane and the power plane with the metal plane providing a ground.

Figure 5:
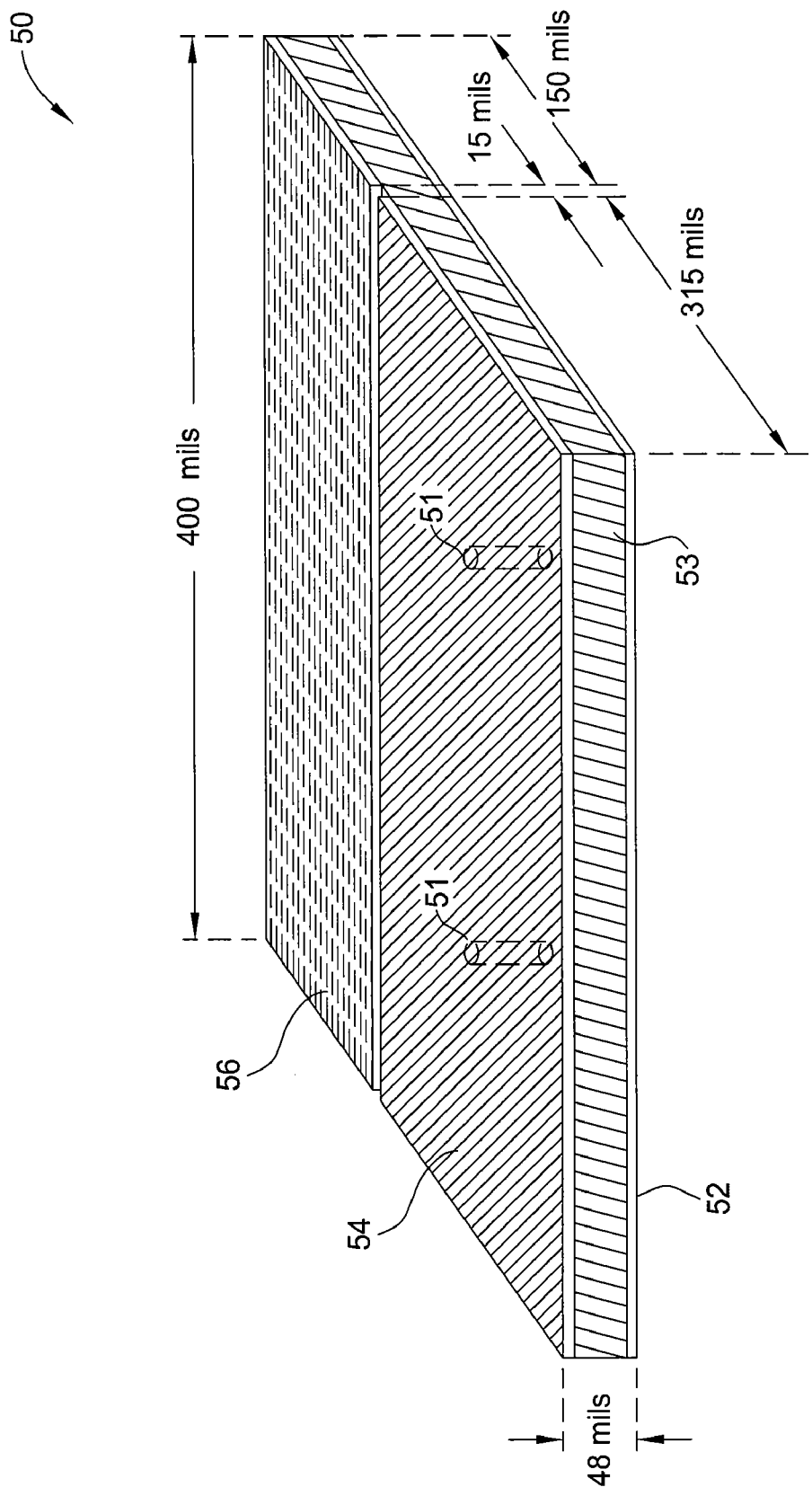
FIG. 5, FIG. 6, FIG. 7, FIG. 8, FIG. 9, FIG. 13, and FIG. 14 illustrate schematic diagrams of motherboards in accordance with the present invention.

Please refer to FIG. 5, which illustrates a schematic diagram of a motherboard 50 in accordance with the present invention process 40. The motherboard 50 includes a first ground plane 52, a power plane 54, and a second ground plane 56. For succinctness, FIG. 5 illustrates corresponding positions of the first ground plane 52, the power plane 54, and the second ground plane 56. The first ground plane 52 is deposited in a first routing layer of the motherboard 50, while the power plane 54 and the second ground plane 56 are in a second routing layer and at a distance of 15 mils from each other. The first ground plane 52 is 4000 mils long and 480 mils wide, the power plane 54 is 4000 mils long and 315 mils wide, and the second ground plane 56 is 4000 mils long and 150 mils wide. Also, a 48-mil-thick dielectric layer (not shown in FIG. 5) is between the first routing layer and the second routing layer. It is clear from these dimensions, and the dimensions on FIG. 5, that the outer boundaries of first ground plane 52 are coextensive with the layer defining the second ground plane 56 and power plane 54 and that first ground plane 52 completely overlies second ground plane 56. The first ground plane 52 and the second ground plane 56 are connected to ground, while the power plane 54 is connected to a power source. Since the first ground plane 52 and the power plane 54 are separated by the 48-mil dielectric layer, and the second ground plane 56 is separated from the power plane 54 by 15 mils providing a higher degree of coupling for the power plane 54 than the first ground plane 52 does. That is, mutual inductance between the power plane and the ground plane is increased effectively in the motherboard 50.

In addition, in the present invention, holes 51 can be punched through the dielectric layer 53 between the second ground plane 56 and the first ground plane 52 every default distance, so as to couple the second ground plane 56 to the first ground plane 52. As a result, the second ground plane 56 and the first ground plane 52 are connected with same ground, which can provide better ground reference.

Figure 6:
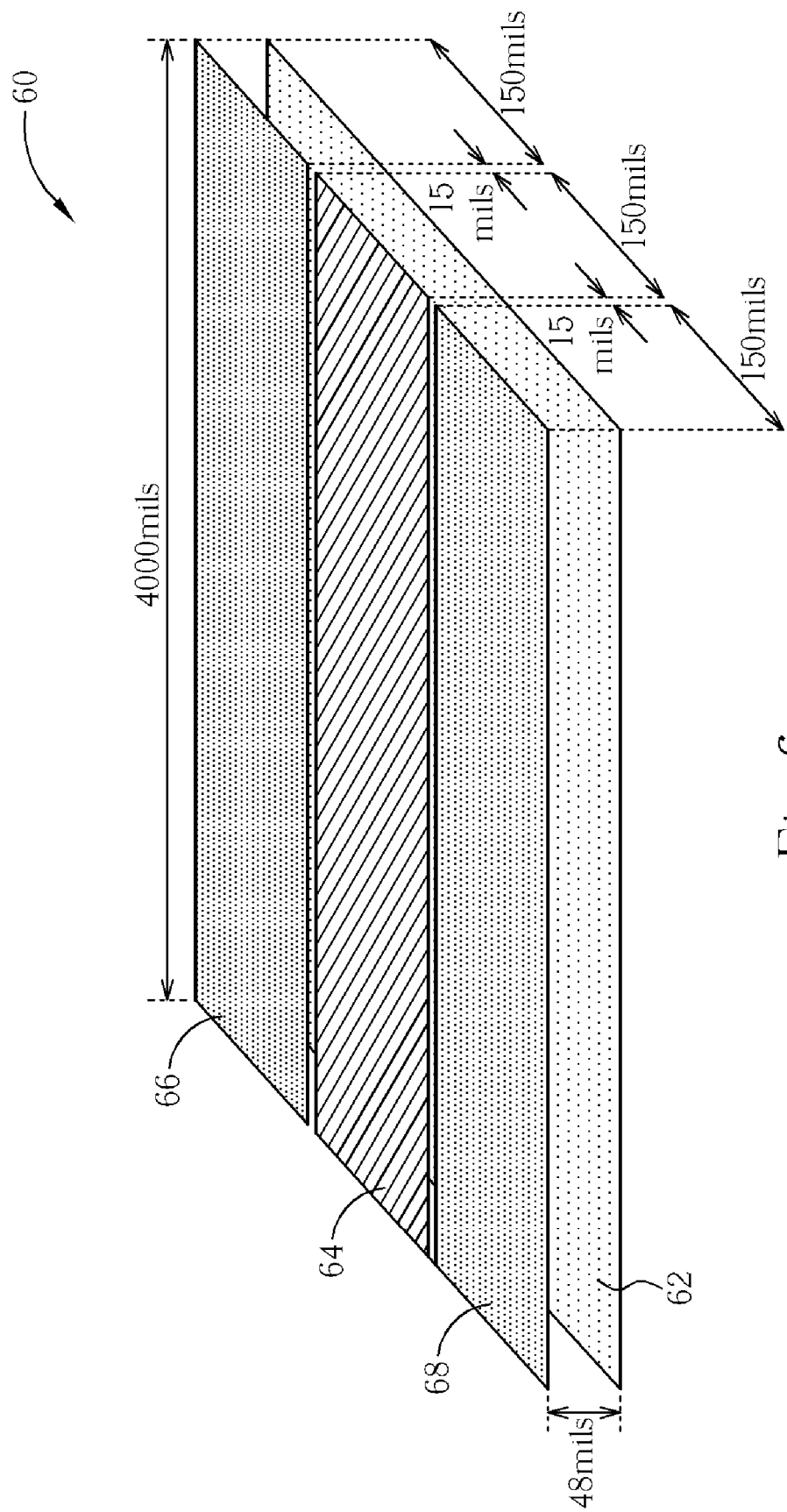

Since the second ground plane 56 can increase the coupling between ground and the power source in the motherboard 50, another ground plane can be formed in the second routing layer of the motherboard 50 for increasing coupling. Please refer to FIG. 6, which illustrates a schematic diagram of a motherboard 60 in accordance with the present invention process 40. The motherboard 60 includes a first ground plane 62, a power plane 64, a second ground plane 66, and a third ground plane 68. For succinctness, FIG. 6 illustrates corresponding positions of the first ground plane 62, the power plane 64, the second ground plane 66, and the third ground plane 68. The first ground plane 62 is deposited in a first routing layer of the motherboard 60, while the power plane 64, the second ground plane 66, and the third ground plane 68 are in a second routing layer. Distances between the power plane 64 and the second ground plane 66, and between the power plane 64 and the third ground plane 68, are 15 mils. The first ground plane 62 is 4000 mils long and 480 mils wide, the power plane 64 is 4000 mils long and 150 mils wide, and the second and third ground plane 66 and 68 are 4000 mils long and 150 mils wide. In addition, a 48-mil-thick dielectric layer (not shown in FIG. 6) is between the first routing layer and the second routing layer. The first ground plane 62, the second ground plane 66, and the third ground plane 68 are connected to ground, while the power plane 64 is connected to a power source.

Comparing to the motherboard 50 in FIG. 5, the third ground plane 68 is added to the motherboard 60 in FIG. 6. As mentioned above, distances between the second ground plane 66 and the power plane 64 and between the third ground plane 68 and the power plane 64 are smaller than the distance between the first ground plane 62 and the power plane 64, so the second ground plane 66 and the third ground plane 68 provide a higher degree of coupling for the power plane 64 than the first ground plane 64 does. Moreover, owing to the additional ground plane 68, the motherboard 60 provides a higher degree of coupling between the power source and ground than the motherboard 50 does. Certainly, in the present invention, holes can be punched through the dielectric layer between the second ground plane 66 and the first ground plane 62 and between the third ground plane 68 and the first ground plane 62 every default distance, so as to couple the second ground plane 66 and the third ground plane 68 to the first ground plane 62. As a result, the first, second, and third ground planes 62, 66, and 68 are connected with same ground, which can provide better ground reference.

In short, the present invention process 40 sets another ground plane in a routing layer having the power plane, so as to increase coupling between the power source and ground, thereby decreasing the loop inductance and input impedance of the power source as well.

Figure 7:
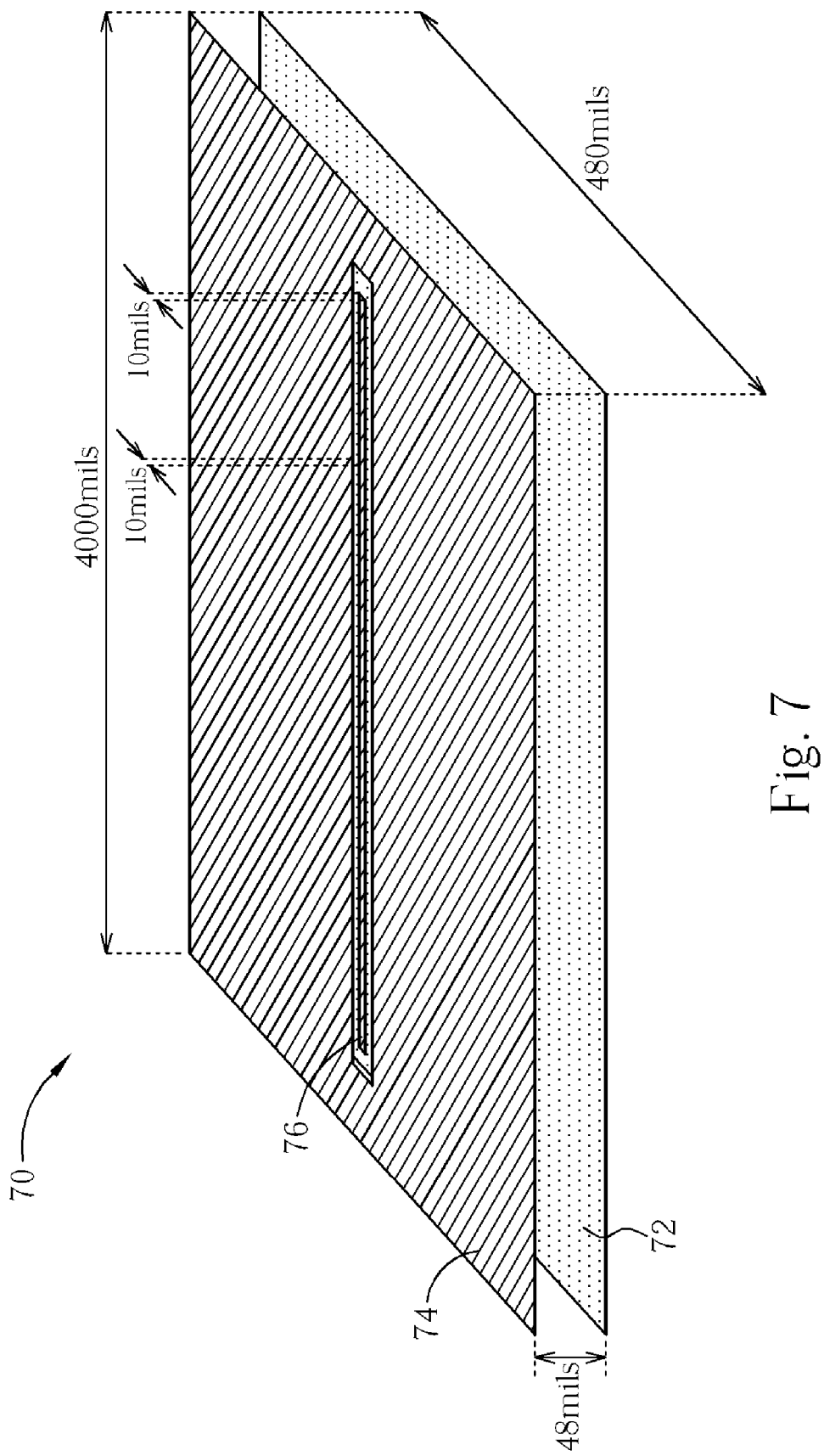

For another embodiment other than the above-mentioned motherboards having ground planes in the same layers as the power planes, please refer to FIG. 7, which illustrates a schematic diagram of another embodiment of a motherboard 70 in accordance with the present invention. The motherboard 70 includes a first ground plane 72, a power plane 74, and a second ground plane 76. For succinctness, FIG. 7 illustrates corresponding positions of the first ground plane 72, the power plane 74, and the second ground plane 76. In FIG. 7, the first ground plane 72 is deposited in a first routing layer of the motherboard 70, and is 4000 mils long and 480 mils wide. The power plane 74 and the second ground plane 76 are deposited in a second routing layer of the motherboard 70. The power plane 74 is 4000 mils long and 480 mils wide and includes a 30-mil notch in the center. The second ground plane 76 is 10 mils wide and is deposited in the notch of the power plane 74 without physically connecting to the power plane 74. That is, in the second routing layer of the motherboard 70, the power plane 74 includes the notch where the second ground plane 76 is deposited. Therefore, when manufacturing the motherboard 70, the power plane 74 and the second ground plane 76 are formed at the same time by etching an annular rectangle on the plated copper of the second routing layer of the motherboard 70, and the second ground plane 76 has holes punched through a dielectric layer to the first ground plane 72 every default distance, so as to connect the second ground plane 76 to the first ground plane 72. As mentioned above, since the distance between the second ground plane 76 and the power plane 74, which is 10 mils, is smaller than distance between the first ground plane 72 and the power plane 74, which is 48 mils, the second ground plane 76 provides a higher degree of coupling than the first ground plane 72 does.

Compared to the motherboard 50, the second ground plane 76 of the motherboard 70 is deposited within the power plane, instead of to one side of the power plane. In some applications, a larger size power plane is needed for decreasing direct resistance between the power plane and the ground plane for the purpose of stable operations, which can be achieved by the motherboard 70 having low loop inductance and low power impedance.

Figure 8:
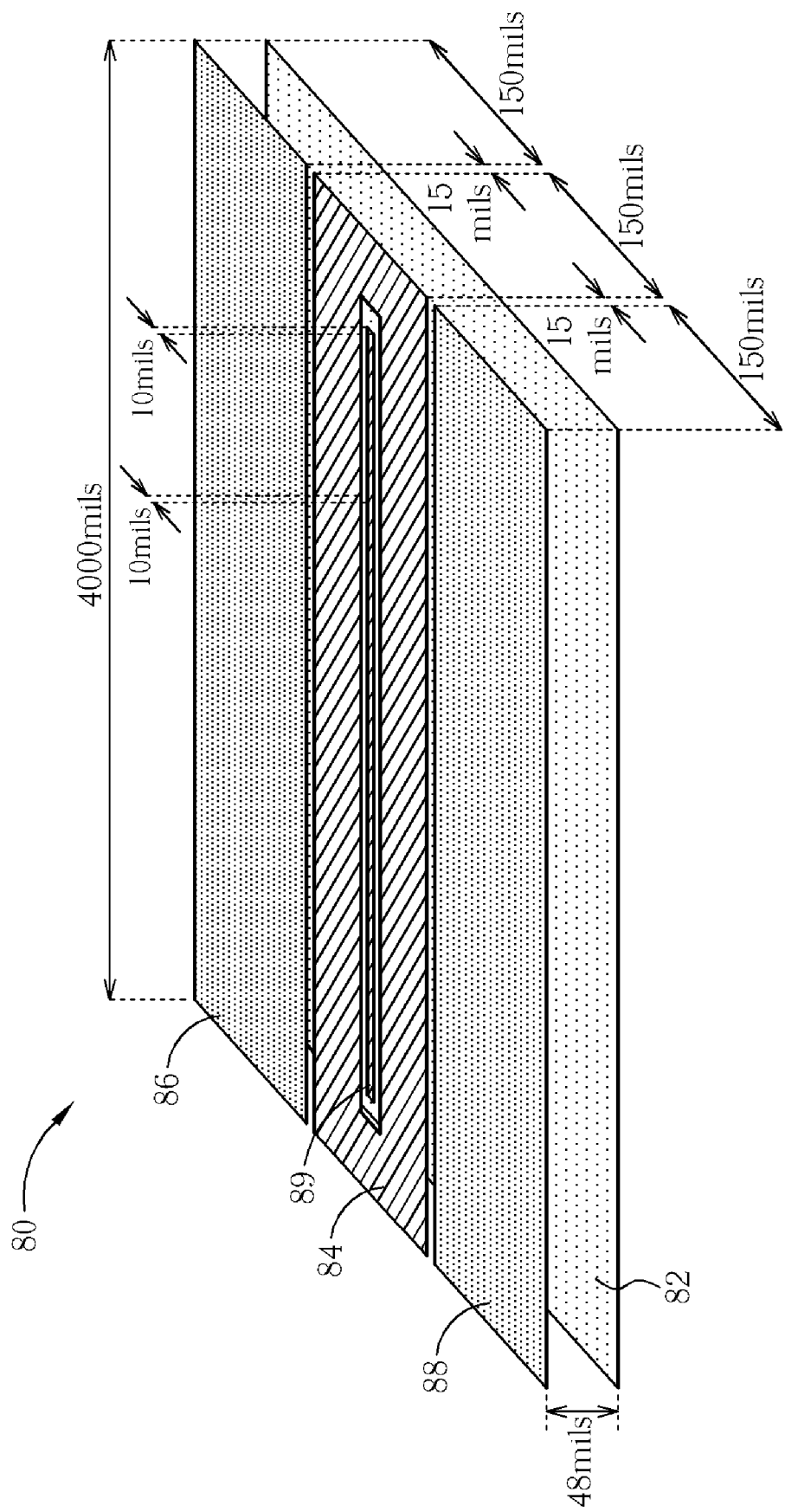

Please refer to FIG. 8, which illustrates a schematic diagram of an embodiment of a motherboard 80 in accordance with the present invention. The motherboard 80 includes a first ground plane 82, a power plane 84, a second ground plane 86, a third ground plane 88, and a fourth ground plane 89. For succinctness, FIG. 8 illustrates corresponding positions of the first ground plane 82, the power plane 84, the second ground plane 86, the third ground plane 88, and the fourth ground plane 89. The first ground plane 82 is deposited in a first routing layer, and is 4000 mils long and 480 mils wide. The power plane 84, the second ground plane 86, the third ground plane 88, and the fourth ground plane 89 are deposited in a second layer of the motherboard 80. As in the motherboard 60 shown in FIG. 6, the second ground plane 86 and the third ground plane 88 are deposited beside the power plane 84, while as in the motherboard 70 shown in FIG. 7, the fourth ground plane is deposited within the power plane 84. As a result, comparing to the motherboards 60 and 70, the motherboard 80 provides a higher degree of coupling for the power plane 84.

Figure 9:
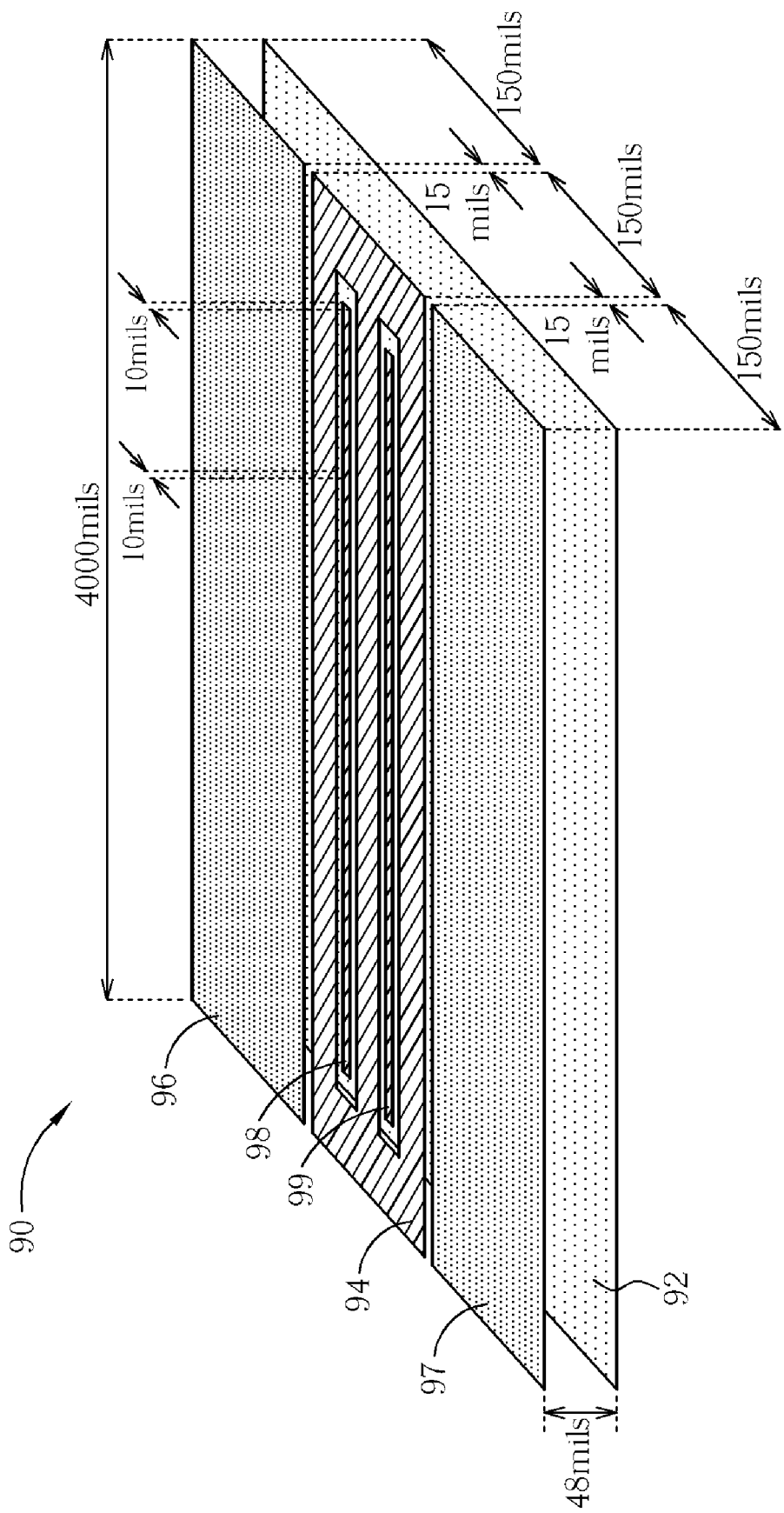

Certainly, another ground plane can be deposited within the power plane 84. Please refer to FIG. 9, which illustrates a schematic diagram of a preferred embodiment of a motherboard 90 in accordance with the present invention. The motherboard 90 includes a first ground plane 92, a power plane 94, a second ground plane 96, a third ground plane 97, a fourth ground plane 98, and a fifth ground plane 99. Therefore, the motherboard 90 includes two ground planes within the power plane 94, which can provide a higher degree of coupling than the motherboard 80 in FIG. 8 does.

Figure 10:
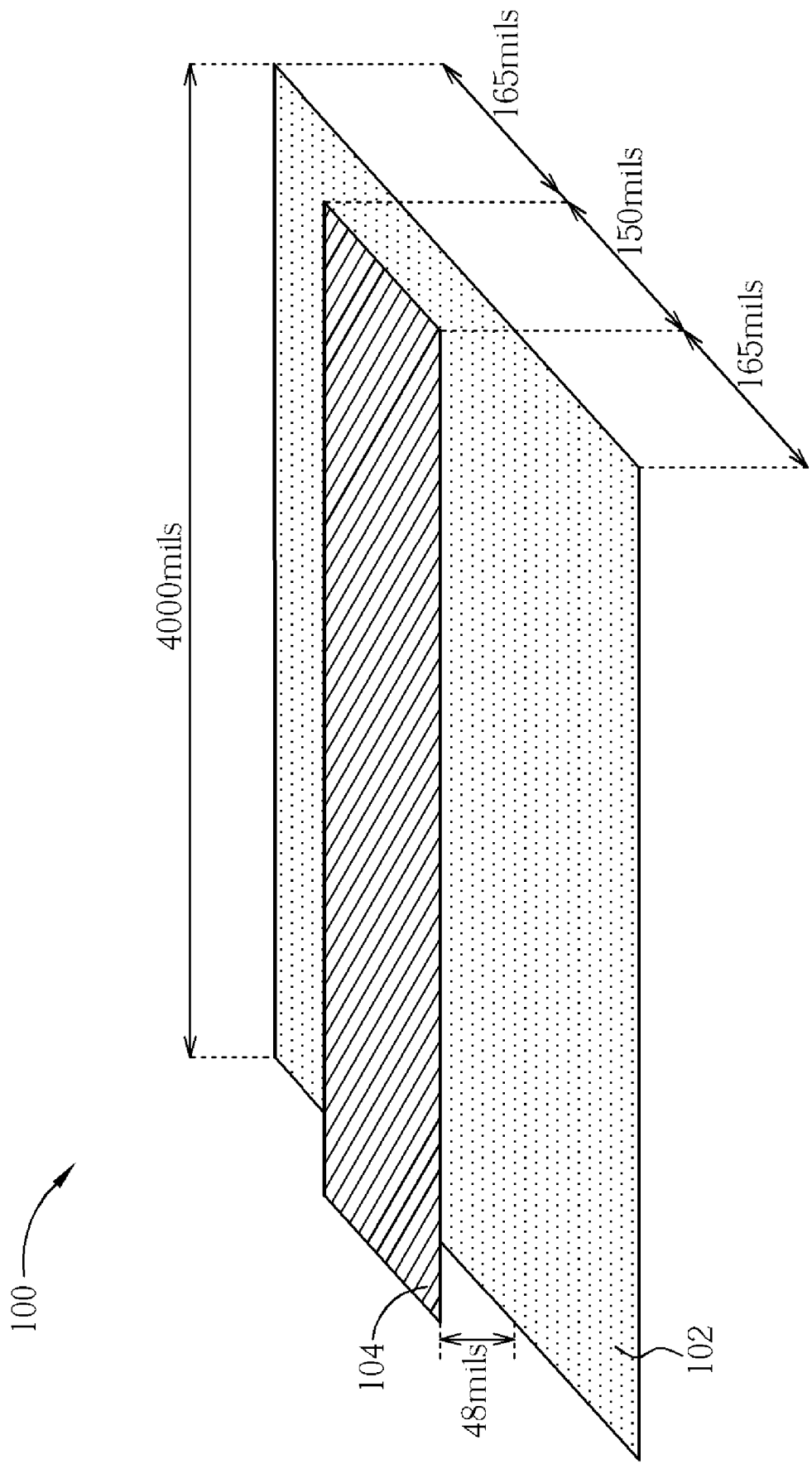
FIG. 10 illustrates a schematic diagram of a motherboard.
Figure 11:
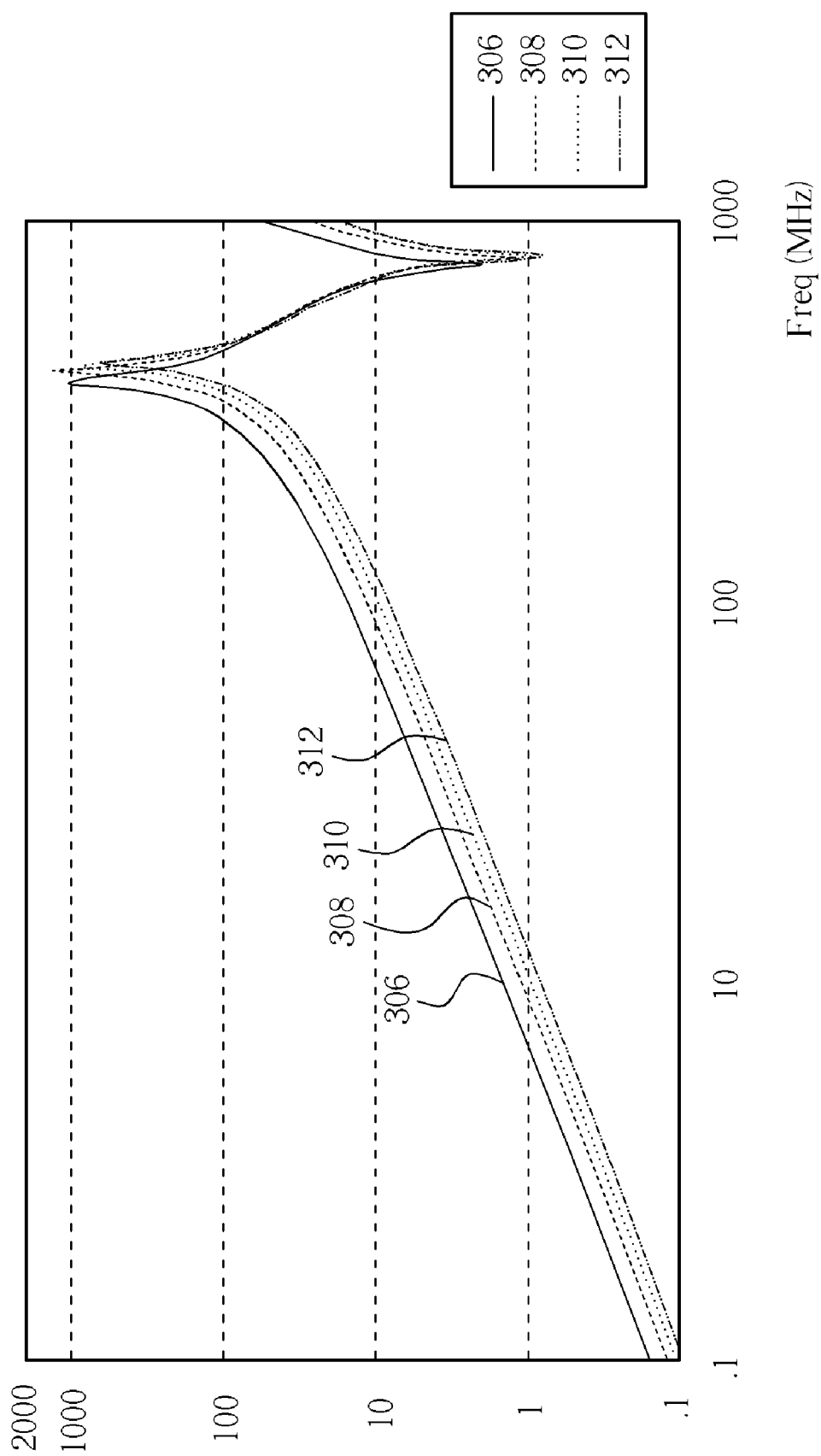
FIG. 11 and FIG. 15 illustrate graphs of input impedance to frequency.

In order to compare effects of the motherboards mentioned above, please refer to the following description. First, please refer to FIG. 10, which illustrates a schematic diagram of a motherboard 100. The motherboard 100 includes a ground plane 102 in a first routing layer and a power plane 104 in a second routing layer. The ground plane 102 is 4000 mils long and 480 mils wide, while the power plane 104 is 4000 mils long and 150 mils wide. As shown in FIG. 10, there is no ground plane beside or within the power plane 104 in the second routing layer. Then, comparing power impedances of the motherboards 100, 60, 80, and 90, please refer to FIG. 11, which illustrates a drawing of the input impedance of the motherboards 100, 60, 80, and 90 in the frequency domain, where the y-axis is input impedance, the x-axis is frequency, and lines 306, 308, 310, and 312 represent relations between input impedance and frequency in the motherboards 100, 60, 80, and 90 respectively. As shown in FIG. 11, with regard to the same frequency, the motherboard 100 has the largest input impedance, then the motherboard 60, then the motherboard 80, and then the motherboard 90 has the smallest input impedance below a critical frequency. That is, when including more ground planes in the routing layer of the power plane, the motherboard has lower input impedance, which broadens bandwidth and increases stability. Moreover, please refer to FIG. 12, which illustrates a table of input impedance, loop inductance, loop resistance, and direct-current resistance of the motherboards 100, 60, 80, and 90. In FIG. 12, as the number of ground planes increase from the motherboard 100 to the motherboard 90, input impedance and loop inductance decrease at 1 MHz, 10 MHz, and 100 MHz. For example, at 100 MHz, the input impedances of the motherboards 100, 60, 80, and 90 are 15.253, 11.292, 0.943, and 0.824 respectively, while corresponding loop inductance $L_{LOOP(100\ MHZ)}$ are 24.276 nH, 17.872 nH, 15.204 nH, and 13.079 nH respectively. However, more ground planes in the routing layer of the power plane make the effective current-flow width of the power plane narrower, causing the direct-current resistance $R_{DC}$, and the loop alternating-current resistance $R_{AC(LOOP)}$ to be larger. As a result, in FIG. 12, the direct-current resistance $R_{DC}$ of the motherboards 100, 60, 80, and 90 are 0.0781, 0.0812, 0.0913, and 0.1073 respectively, and the loop alternating-current resistance $R_{AC(Loop)}$ at 100 MHz are 0.0173, 0.0159, 0.0189, and 0.0238 respectively. That is, as the number of ground planes inserted inside the power plane increases, the resistance $R_{DC}$ and $R_{AC(LOOP)}$ increase accordingly.

Figure 13:
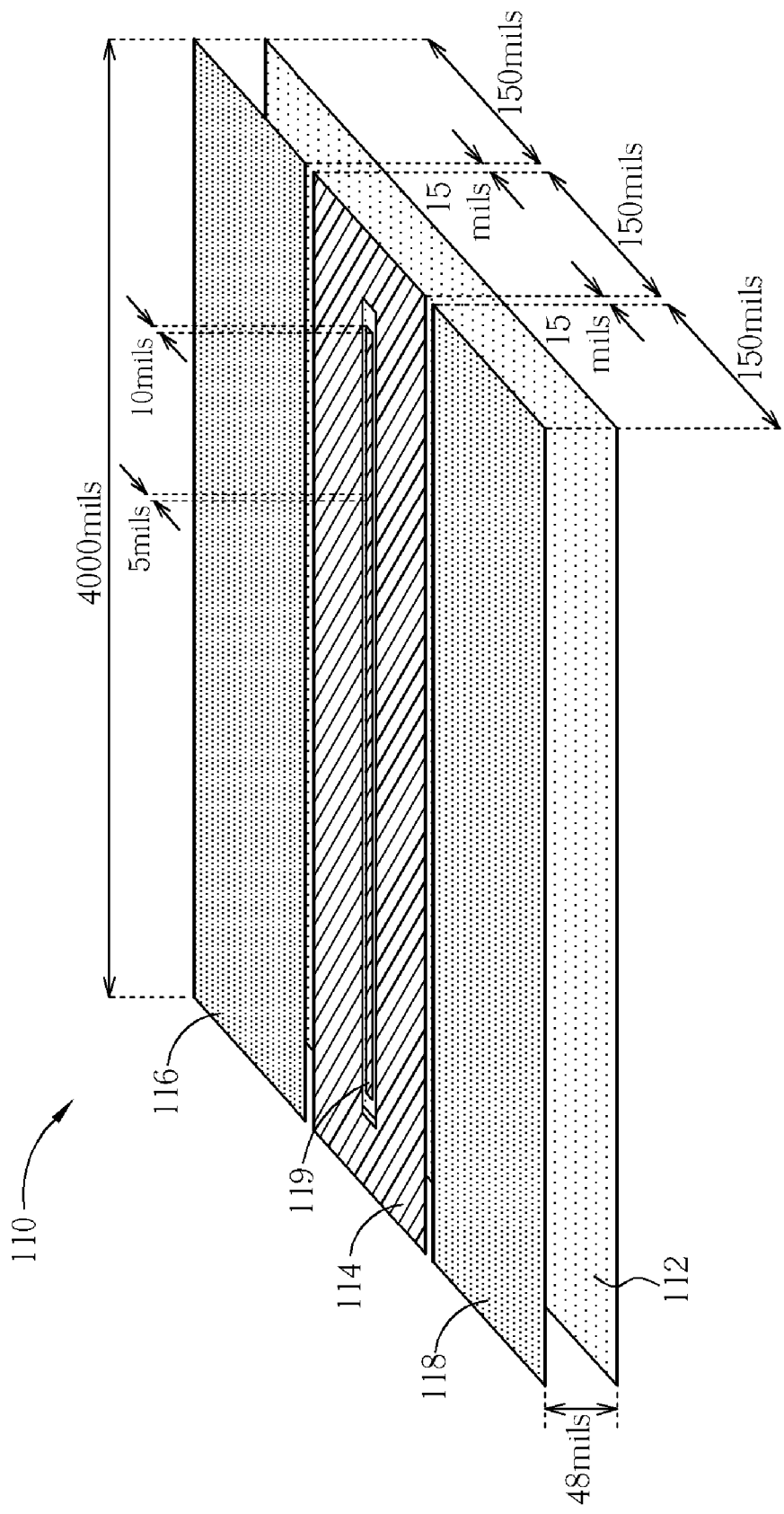
Figure 14:
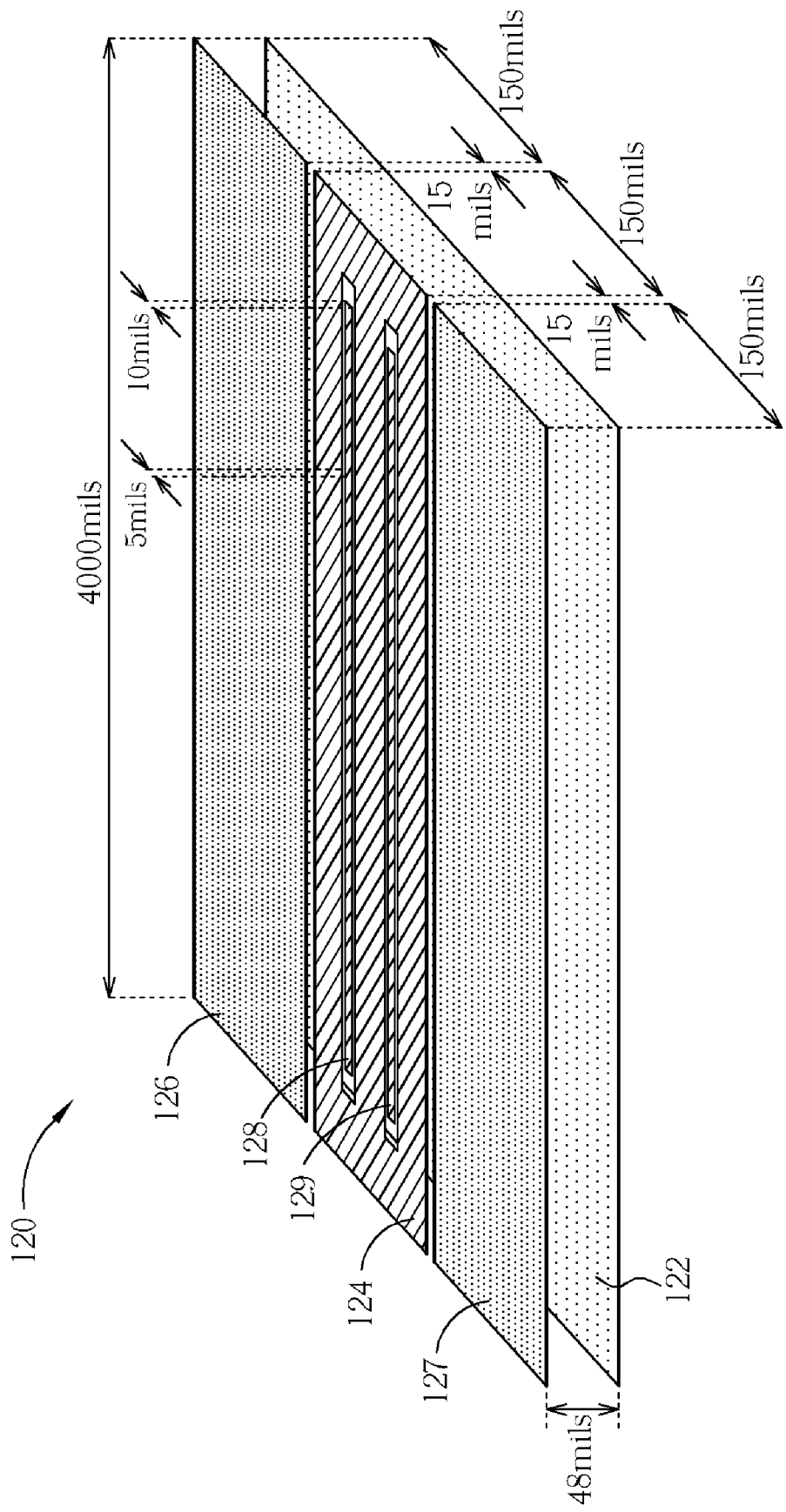

Therefore, if the area of the power plane is increased and the coupling between the power source and ground is kept steady, then a motherboard with low loop inductance and acceptable resistance can be obtained. Please refer to FIG. 13 and FIG. 14, which illustrate schematic diagrams of motherboards 110 and 120. The motherboard 110 includes a first ground plane 112, a power plane 114, a second ground plane 116, a third ground plane 118, and a fourth ground plane 119. Comparing to the motherboard 80 in FIG. 8, the motherboard 110 is an improved version of the motherboard 80, where distance between the fourth ground plane 119 within the power plane 114 and the power plane 114 in the motherboard 110 is 5 mils, less than that in the motherboard 80 in FIG. 8, or 10 mils. As a result, the motherboard 110 has lower direct-current resistance $R_{DC}$ and loop resistance $R_{AC(LOOP)}$ than the motherboard 80. Similarly, in FIG. 14, the motherboard 120 includes a first ground plane 122, a power plane 124, a second ground plane 126, a third ground plane 127, a fourth ground plane 128, and a fifth ground plane 129, which is an improved version of the motherboard 90 in FIG. 9, while distances between the fourth ground plane 128 and the power plane 124 and between the fifth ground plane 129 and the power plane 124 in the motherboard 120 are 5 mils, less than those in the motherboard 90 in FIG. 9, or 10 mils.

Figure 15:
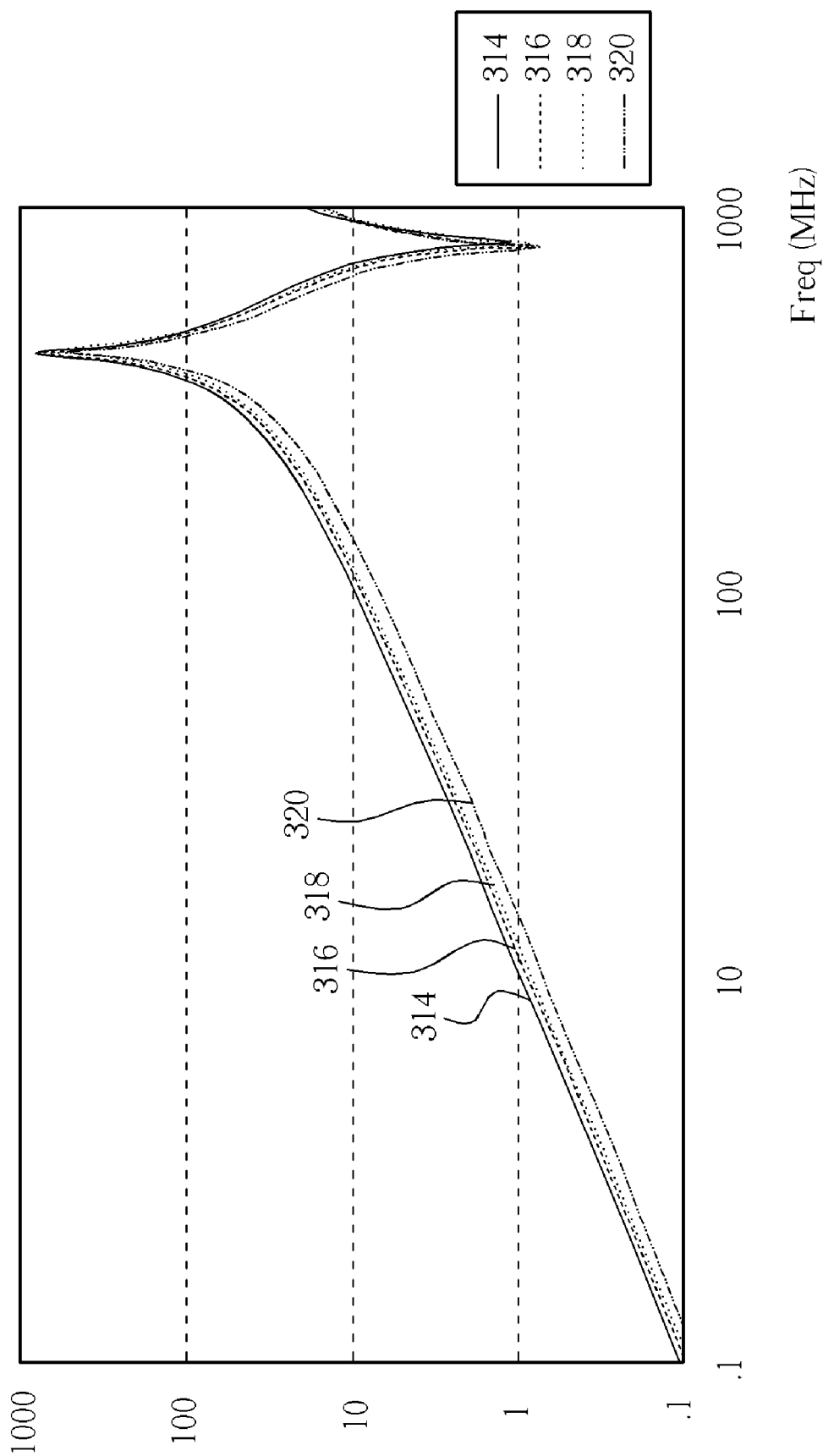

Please refer to FIG. 15, which illustrates a graph of input impedance of the motherboards 80, 110, 90, and 120 in the frequency domain, where the y-axis is input impedance, the x-axis is frequency, and lines 314, 316, 318, and 320 represent relations between input impedance and frequency in the motherboards 80, 110, 90, and 120 respectively. Please refer to FIG. 16, which illustrates a table of input impedance, loop inductance, loop resistance, and direct-current resistance of the motherboards 80, 110, 90, and 120 at different frequencies. In FIG. 16, the motherboard 110 has lower input impedance, loop inductance, and direct-current resistance than the motherboard 80. Similarly, the motherboard 120 also has lower input impedance, loop inductance, and direct-current resistance than the motherboard 90. Therefore, comparing to the motherboards 80 and 90, the motherboards 110 and 120 provide a higher degree of coupling, wider bandwidth, and more stability.

In summary, the present invention process 40 increases coupling between the power source and ground with additional ground planes in the routing layer of the power plane in a PCB, so as to decrease input impedance, increase bandwidth, and provide a stable system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for decreasing impedance of a power source in a printed circuit board, comprising:
    forming a first metal plane in a first routing layer of the printed circuit board;
    forming a second metal plane and a third metal plane horizontally spaced therefrom, in a second routing layer of the printed circuit board, the second and third metal planes being vertically spaced from the first metal plane, the vertical spacing between the first metal plane and the second and third metal planes being greater than the horizontal spacing between the second and third metal planes, the third metal plane entirely overlying the first metal plane and being connected to a common electrical ground potential, the third metal plane being formed in a first notch formed in the second metal plane, and the third metal plane defined entirely within the second metal plane and being insulated from the second metal plane, wherein a dielectric layer is disposed between the first routing layer and the second routing layer of the printed circuit board for insulating the first routing layer from the second routing layer;
    connecting the second metal plane to a first electric potential different from the common electrical ground potential, wherein the first metal plane and the third metal plane are both connected to the common electrical ground potential; and
    punching holes through the dielectric layer between the first metal plane and the third metal plane for connecting the third metal plane with the first metal plane.

2. The method of claim 1, further comprising forming a fourth metal plane within the second routing layer of the printed circuit board, wherein the fourth metal plane is connected to the common electrical ground potential.

3. The method of claim 2, further comprising forming a fifth metal plane within the second routing layer and horizontally spaced from the second and the third metal planes, wherein the fifth metal plane is connected to the common electrical ground potential.

4. A method for decreasing impedance of a power source in a printed circuit board, the method comprising:
    forming a first metal plane in a first routing layer of the printed circuit board;
    forming a second metal plane and a third metal plane horizontally spaced therefrom in a second routing layer of the printed circuit board, the second and third metal planes being vertically spaced from the first metal plane, the vertical spacing between the first metal plane and the second and third metal planes being greater than the horizontal spacing between the second and third metal planes, and the third metal plane being connected to a common electrical ground potential, wherein a dielectric layer is disposed between the first routing layer and the second routing layer of the printed circuit board for insulating the first routing layer from the second routing layer;
    connecting the second metal plane to a first electric potential different from the common electrical ground potential, wherein the first metal plane and the third metal plane are both connected to the common electrical ground potential; and
    forming a first notch in the second metal plane defining a first enclosed region that is enclosed by the second metal plane, wherein the third metal layer is disposed entirely within the first enclosed region defined by the first notch.

5. The method of claim 4, further comprising the step of forming a fourth metal plane within the second routing layer, wherein the fourth metal plane is connected to the common electrical ground potential.

6. The method of claim 5, further comprising the step of forming a second notch in the second metal plane defining a second enclosed region that is enclosed by the second metal plane, wherein the fourth metal layer is disposed entirely within the second enclosed region defined by the second notch.

7. The method of claim 6, further comprising the step of punching holes through the dielectric layer between the first metal plane and the fourth metal plane for connecting the fourth metal plane with the first metal plane.

8. A printed circuit board, comprising:

a first routing layer that includes a first metal plane;

a second routing layer that includes a second metal plane and a third metal plane horizontally spaced therefrom, wherein the second and third metal planes are vertically spaced from the first metal plane, the vertical spacing between the first metal plane and the second and third metal planes is greater than the horizontal spacing between the second and third metal planes, the third metal plane entirely overlies the first metal plane and is connected to a common electrical ground potential, the third metal plane is formed in a first notch formed in the second metal plane, and the third metal plane is defined entirely within the second metal plane and is insulated from the second metal plane; and a dielectric layer disposed between the first routing layer and the second routing layer of the printed circuit board for insulating the first routing layer from the second routing layer, wherein the second metal plane is connected to a first electric potential different from the common electrical ground potential, wherein the first metal plane and the third metal plane are both connected to the common electrical ground potential, and wherein holes are punched through the dielectric layer between the first metal plane and the third metal plane for connecting the third metal plane with the first metal plane.

9. The printed circuit board of claim 8, wherein the second routing layer further includes a fourth metal plane that is connected to the common electrical ground potential.

10. The printed circuit board of claim 9, wherein the second routing layer further includes a fifth metal plane that is horizontally spaced from the second and the third metal planes, and wherein the fifth metal plane is connected to the common electrical ground potential.

* * * * *